United States Patent [19]

Modarres et al.

[11] Patent Number: 4,918,614
[45] Date of Patent: Apr. 17, 1990

[54] HIERARCHICAL FLOORPLANNER

[75] Inventors: Hossein Modarres, Mountain View; Susan Raam, Fremont; Jiun-Hao Lai, Santa Clara, all of Calif.

[73] Assignee: LSI Logic Corporation, Milpitas, Calif.

[21] Appl. No.: 57,843

[22] Filed: Jun. 2, 1987

[51] Int. Cl.⁴ .............................................. G06F 15/60
[52] U.S. Cl. .................................... 364/490; 364/489
[58] Field of Search ............... 364/488, 489, 490, 491, 364/480

[56] References Cited

U.S. PATENT DOCUMENTS

| | | | |
|---|---|---|---|
| 4,500,963 | 2/1985 | Smith et al. | 364/488 |
| 4,554,625 | 11/1985 | Otten | 364/491 |
| 4,612,618 | 9/1986 | Pryor et al. | 364/490 |
| 4,630,219 | 12/1986 | DiGiacomo et al. | 364/490 |
| 4,688,072 | 8/1987 | Heath et al. | 364/491 |

Primary Examiner—Bruce Y. Arnold
Assistant Examiner—Terry S. Callaghan
Attorney, Agent, or Firm—Skjerven, Morrill, MacPherson, Franklin & Friel

[57] ABSTRACT

A system in which logic and/or memory elements are automatically placed on an integrated circuit ("floorplanning") taking into account the constraints imposed by the logic designer, not only increase the density of the integrated circuit, and the likelihood of routing interconnections among the elements on that circuit, but it also enables the user to quickly modify the floorplan manually, and then graphically display the results of such modifications. By conforming itself to the logic designer's modular, hierarchical design, the system is capable of placing elements at each level of the specified hierarchy, based upon the number of interconnections between elements throughout that hierarchy. The system includes means for estimating the size of elements which have not yet been laid out, and for partitioning groups of elements into successively smaller "slices" of the integrated circuit (using heuristic techniques when exhaustive methods are no longer feasible) until all elements are placed relative to one another. The system also includes means for determining the precise shapes of elements on the integrated circuit, based upon the relative placement of such elements, and upon the additional area required for routing interconnections among such elements. The functionality of this hierarchical floorplanning system can be embodied in the form of software, hardware or any combination thereof, because the system's hierarchical methodology and structure is independent of its particular embodiment.

17 Claims, 11 Drawing Sheets

Microfiche Appendix Included
(4 Microfiche, 138 Pages)

SYSTEM ARCHITECTURE

HIERARCHY OF FUNCTIONS

NET LIST

| NET 1 | A1 - C111 - E1 - E22 |
| NET 2 | A1 - C111 - C112 |
| NET 3 | A2 - A3 - C2 |
| ⋮ | |
| NET X | A1 - A2 - A3 - B - D |

SYSTEM ARCHITECTURE

EXPECTED NUMBER OF CONNECTIONS

| NET 1 | A1 - C111 - E1 - E22 |
|---|---|

Spanning Tree (minimum number of connections)

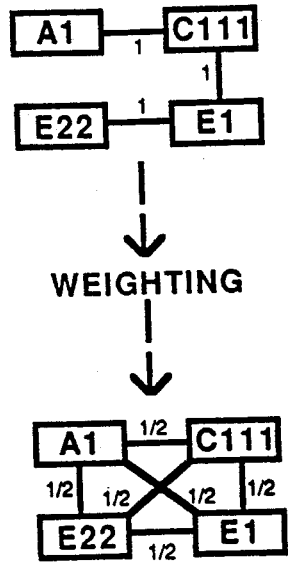

Permutations of Connected Pairs of Functions $$\left(\frac{(X)(X-1)}{2}\right) = \frac{(4)(4-1)}{2} = 6$$

| | | |
|---|---|---|
| Permutation 1 | A1 - | C111 |
| Permutation 2 | A1 - | E1 |
| Permutation 3 | A1 - | E22 |
| Permutation 4 | C111 - | E1 |
| Permutation 5 | C111 - | E22 |
| Permutation 6 | E1 - | E22 |

| Expected Number of Connections after processing NET 1 (Terminal Functions) | | | Expected Number of Connections after processing NET 1 (brought up to LEVEL 2) | | |
|---|---|---|---|---|---|
| A1 | - C111 | 1/2 | A | - C | 1/2 |
| A1 | - E1 | 1/2 | | | |
| A1 | - E22 | 1/2 | A | - E | 1 |
| C111 | - E1 | 1/2 | | | |
| C111 | - E22 | 1/2 | C | - E | 1 |
| E1 | - E22 | 1/2 | | | |

FIGURE 3

EXHAUSTIVE PARTITIONING
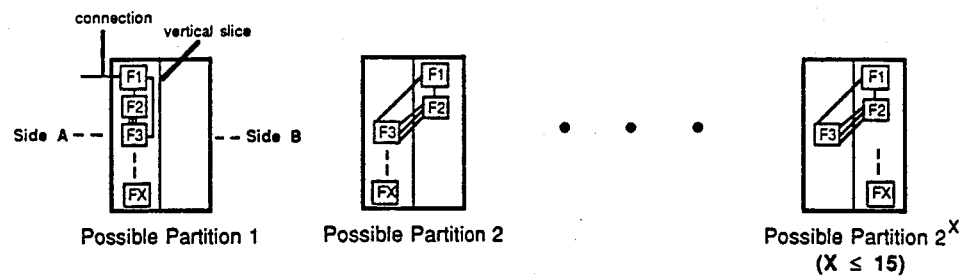
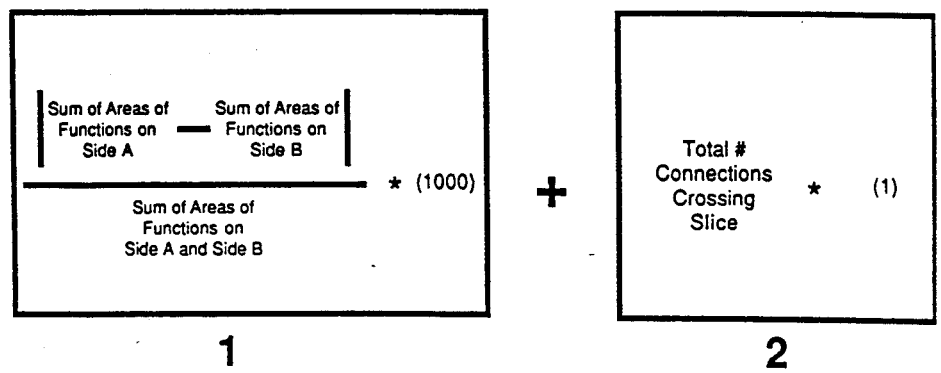
FIGURE 5

RESULTS OF SHAPE DETERMINATION (LEVEL 2)

SHAPE FUNCTION DETERMINATION
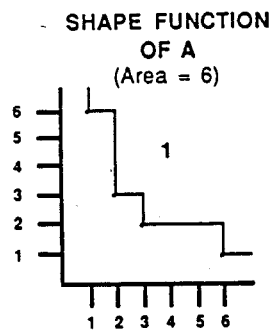
SHAPE FUNCTION OF A (Area = 6)
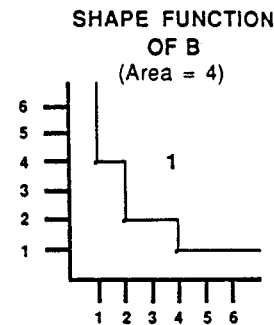
SHAPE FUNCTION OF B (Area = 4)
After Relative Placement
FUNCTION X (parent of A and B)
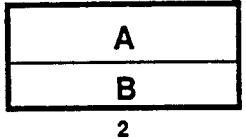
Range of Possible Shapes
1x6, 2x3, 3x2, 4x2, 5x2, 6x1
1x4, 2x2, 3x2, 4x1, 5x1, 6x1
3  S1 = (LARGER of X coords, SUM of Y coords)
4  S2 = (SUM of X coords, LARGER of Y coords)
SHAPE FUNCTION OF X (parent of A and B)
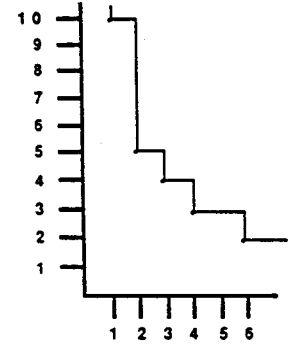
FIGURE 8

ROUTING CHANNEL ALLOCATION

RESULTS OF ROUTING CHANNEL ALLOCATION
(ALL FIVE LEVELS)

HIERARCHICAL FLOORPLANNER

FIELD OF THE INVENTION

This invention relates to the placement of interconnected functional devices on an integrated circuit chip ("floorplanning"), and to a method for doing so which reduces the required chip area and increases the routability of the interconnections within that area of the chip.

BACKGROUND OF THE INVENTION

Floorplanning is the process of placing functional devices ("functions," also referred to as modules, elements, blocks or functional blocks) on a chip, and allocating interconnection space among them, so as to minimize the actual chip area required to encompass such functions and their interconnections, and to maximize the probability that such interconnections can be routed within that area.

A function consists of a discrete logic and/or memory element, or any combination of such elements. It may be as simple as an inverter or a flip-flop, consisting of one or only a few transistors, or as complex as a shift register, an ALU or even an entire microprocessor, consisting of hundreds of thousands of transistors.

From a mathematical point of view, both formulating and solving the floorplanning problem are quite difficult. A precise mathematical solution essentially cannot be obtained. Heuristic algorithms are therefore employed to approximate the optimum solution to the floorplanning problem.

Moreover, due to the increasing complexity of chip designs, necessitating more and more logic and/or memory elements per unit area, the complexity of the floorplanning problem has increased dramatically. It is, therefore, extremely advantageous to automate this process in some fashion.

Prior to the floorplanning process itself, which involves the placement of functions on a chip, the chip's logic must be designed. Logic designers generally employ hierarchical design techniques to determine the appropriate selection and interconnection of logic and/or memory devices which will enable the chip to perform the desired function. These techniques involve describing the chip's functionality at various "levels of abstraction," ranging from the most general function performed by the chip to the precise functions performed by each logic and/or memory element on the chip.

Thus, a logic designer's hierarchy consists of N levels of functions, where N is an integer (N≧1) representing the number of hierarchical levels of functionality in the chip, the first level being the chip itself, and where n is an integer (1≦n≦N) representing the level of any particular function in the hierarchy.

A "parent" function at the (n)th level of the hierarchy is defined as a plurality of (n+1)st level "children" functions, each of which is a "child" function. For example, a microprocessor at the (n)th level might be defined as the parent of the following (n+1)st level children: an ALU, a series of registers, a bus and various other functions (each of which may or may not have a plurality of (n+2)d level children, and so on).

Each child function which is not also a parent function (i.e., which has no children) is referred to as a "terminal" (or "leaf") function. Each terminal function is connected to at least one other terminal function, such connection commonly being referred to as a "net." A series of nets, each of which defines a plurality of interconnected functions, is commonly referred to as a "net list."

Note that lower levels of the hierarchy are commonly denoted by successively higher numbers. Thus, while level 1 refers to the top (chip) level of the hierarchy, levels 2, 3 and 4 constitute successively "lower" levels of the hierarchy.

Previous floorplanning techniques roughly fall into two basic categories: (1) "flat" floorplanners, which attempt to minimize space at only one level (the "level" which is created when the hierarchy is flattened by omitting all but the terminal functions), by placing only terminal functions; and (2) "top-automated" floorplanners, which automate the floorplanning process at only the top level, by placing only 2d level functions.

In essence, there are three significant floorplanning obstacles which previous methods have not overcome:

(1) Hierarchical Estimation of Unknown Function Area When the floorplanning process begins, the precise area of each function may not be known, because certain functions have not yet been laid out. Only after the elements of a given function have been laid out, taking all interconnections into account, can the precise area of that function be determined.

Although the interconnection area within a function (whose elements have not yet been laid out) is the dominant factor in determining the overall area occupied by that function, previous methods do not include means for estimating this interconnection area (and thus the area of the function) throughout the hierarchy of functions. Such methods are limited to estimating the interconnection area of a "flat" design by multiplying the total area of the functions themselves by a statistically determined percentage.

(2) Maintenance of Modularity Once a chip's logic has been designed in a hierarchical fashion (with each parent defined as a plurality of its children), it is important that the floorplanning process not interfere with or destroy the logic designer's approach. Flat floorplanners place only terminal functions, which may occur at many different levels of the hierarchy. Such floorplanners may well destroy the hierarchy imposed by the logic designer, by placing children outside of the area occupied by their parent.

Logic designers often desire to cluster various functions (children) together into a larger function (parent). This is done for a variety of reasons, such as the speed of interaction between two functions, which reasons are generally not factored into the floorplanning process. Floorplanning below the level of the larger (parent) function, however, may result in the unclustering of the component (children) functions, thereby eliminating the functional advantages created by the logic designer's hierarchical design.

(3) Hierarchical Interconnection of Functions By far the most significant obstacle to achieving the optimum floorplan is the fact that optimizing the floorplan at any given level in the hierarchy requires knowledge of functional interconnections at other levels. Because logic and/or memory elements are interconnected throughout the logic designer's hierarchy (not merely at the bottom level), optimum floorplanning at any level requires a hierarchical approach which takes these inter-level interconnections into account.

Previous floorplanning methods are not hierarchical, in that they do not take into account this interaction among functions at different levels in the hierarchy. Flat floorplanning techniques consider only the "level" composed of terminal functions. There may be such a large number of these terminal functions that even automated techniques require too much time to be considered feasible.

Moreover, as discussed above, floorplanning at this "level" may well violate the hierarchy imposed by the logic designer. The need for truly hierarchical floorplanning is perhaps best evidenced by the desire of companies to classify essentially flat floorplanning techniques as hierarchical. See, e.g., McLeod, Jonah, "Now Designers Can Skip Floor-Planning Details," *Electonics*, April 30, 1987, pp. 61-62; and Ueda, Kazuhiro, et al., "CHAMP: Chip Floorplanning For Hierarchical VLSI Layout Design," *IEEE Transactions on Computer-Aided Design*, Vol. CAD-4, No. 1, January, 1985, pp. 12-22.

Top-automated floorplanning techniques also only operate at one (the top) level. Floorplanning even at this level does not adequately take into account the placement and interconnection of functions at lower levels, because the placement of such functions at these lower levels is determined manually before this automated process even begins. Thus, automated floorplanning at the top level is constrained to be suboptimal to the extent that the manual placement of functions at lower levels is suboptimal.

Previous methods do, however, include single-level floorplanning techniques. One such technique involves "partitioning" the functions into two groups to minimize the number of interconnections between the groups. This procedure is recursively applied to force heavily connected functions to be placed next to one another, resulting in the formation of clusters of functions which minimize required routing space. See Kernighan, B. W. and S. Lin, "An Efficient Heuristic Procedure for Partitioning Graphs," *The Bell System Technical Journal*, February, 1970, pp. 291-307.

Another technique (often used in conjunction with partitioning) involves "slicing" or dissecting the chip area into rectangular "slicing regions" (regions within which each of the partitioned groups of functions can be placed), and then placing each partitioned group of functions in one of such regions, so as to minimize the wasted area, and hence the total chip area. See Otten, Ralph, H. J. M., "Layout Structures," *IBM Research Report*, No. RC 9657 (#42647), October 28, 1982.

Such single-level floorplanning methods simply do not, however, take into account the constraints imposed by the logic designer's hierarchy, such as the hierarchical clustering of children functions within their parent functions, and the interconnection of functions across the various levels of that hierarchy.

SUMMARY OF THE INVENTION

This invention overcomes the above obstacles by providing a truly hierarchical floorplanning system. It approximates a globally optimum solution to the floorplanning problem by taking into account, while floorplanning at each level of the logic designer's specified hierarchy, the clustering and interconnection of functions across all levels of that hierarchy.

In essence, this invention encompasses a method of placing functions on an integrated circuit, said integrated circuit comprising a hierarchy of N levels of functions,
  where N is an integer ($N \geq 1$) representing the number of hierarchical levels of functionality in the integrated circuit, the first of said levels representing the integrated circuit as a whole, and
  where n is an integer ($1 \leq n \leq N$) representing the level of any particular function in the hierarchy,
  said hierarchy defining at least one of said (n)th level functions (a parent function) as a plurality of (n+1)st level functions (children functions, each being a child function),
    each child function (which is not also a parent function) being a terminal function, each terminal function being connected to at least one other terminal function, by at least one net,
    each net defining a plurality of interconnected terminal functions,
comprising the steps of
  estimating the number of connections among functions throughout all N levels of the hierarchy, and
  determining the location on the integrated circuit of each (n)th level function in the hierarchy, based in part upon said estimated number of connections.

This hierarchical floorplanning invention overcomes the above-described obstacles, which previous one-level floorplanners have yet to overcome, in the following manner:

(1) Hierarchical Estimation of Unknown Function Area The present invention estimates the area of all terminal functions whose elements have not yet been laid out, and then estimates the area of all other (parent) functions. Moreover, it repeatedly updates these estimates as children are placed within their parent, yielding a more accurate estimate of the parent's area.

To avoid unwarranted complexity, each function is geometrically represented as a rectangle. Moreover, each function must fall into one of the following three categories: (1) a "megacell" function (a terminal function, including pad functions, which contains only one cell, which cell has already been laid out, and therefore has fixed dimensions), (2) a "macrocell" function (a terminal function which contains many small cells, which may, for example, be approximately 2500 square microns each, the collection of which has not yet been laid out, and therefore has no fixed dimensions) or (3) a "function of functions" (a nonterminal function which has two or more children functions).

The area of megacell functions is already known. The area of macrocell functions can be estimated with reasonable accuracy once the sum of the areas of the macrocells within that function, and the average number of tracks per channel connecting such macrocells, are determined. Although the sum of the areas of the macrocells is known, the number of tracks per channel connecting such macrocells must be derived statistically. This method of statistically estimating the number of tracks per channel connecting macrocells is described in greater detail below.

Once the areas of terminal functions (megacell and macrocell functions) are known, the area of any function of functions can be estimated, but not by the same statistical method. Even though the sum of the areas of its children may be known, the number of such children is generally not large enough to yield a statistically accurate result.

Yet, the area of each function of functions can be estimated by adding, to the sum of the areas of its children, a percentage of such area equal to the percentage of the available routing space on the chip. In other words, the available area on the chip for routing interconnections among functions is distributed equally among all such functions throughout the hierarchy.

The estimated area of each such function of functions can then be updated as its children are shaped and placed within their parent, thereby determining its precise shape, and thus its precise area. As will be apparent from the detailed description below, the estimation of each function's area is vital to the later placement of such functions.

(2) Maintenance of Modularity Floorplanning is done hierarchically, with the constraint that the entire hierarchy of functions be maintained while floorplanning at each particular level.

The placement of functions (relative to one another within their parent function) is also determined hierarchically. Connections between functions throughout the hierarchy are weighted so as to represent the expected number of connections between such functions. Functions at each level are then partitioned within their parent, based in part upon this weighting, and binary "slicing trees" are created—i.e., binary trees which represent the relative placement of functions within their parent at each particular level.

The top level of each parent function's slicing tree consists of one node, representing all of its children. This node has two "child" nodes, each containing one of two partitioned groups of the function's children, geometrically separated by the first slice of the parent function into two slicing regions. Each subsequent node contains two subsequently partitioned groups of functions created by subsequent slices of the parent, until, finally, each terminal node contains only one of the parent's children.

Thus, for example, the top node of the slicing tree of a function Z with five children (A, B, C, D and E) would contain all five children. Its two "child" nodes might be node (A, B and C) and node (D and E). The two "child" nodes of node (D and E) would be terminal nodes (D) and (E), whereas the two "child" nodes of the node (A, B and C) might be node (A and B) and terminal node (C). Finally, the two "child" nodes of node (A and B) would be terminal nodes (A) and (B).

These slicing trees are linked together (to the slicing trees of their children) by the hierarchy tree in order to correlate different levels. Returning to the above example, if function A has two children (A1 and A2), the bottom node (A) of the slicing tree of Z (the parent of A) would be linked to the slicing tree of function A (the top level of which contains both A1 and A2).

This linking of slicing trees illustrates how the system maintains the hierarchy imposed by the logic designer. In essence, slicing trees represent the placement of children functions within their parent function.

The shape of each function is also determined hierarchically, by first determining a shape function which incorporates a range of possible shapes of that function, and then determining the shape function of its parent function by "adding" the shape functions of each of the parent's children. By determining the shape functions in this modular manner, each child's shape fits within its parent's shape, thus enabling the system to place each child within the area on the chip occupied by its parent, thereby maintaining the hierarchy imposed by the logic designer.

Thus, hierarchical slicing trees and shape functions enable floorplanning at each level while maintaining the modular hierarchy imposed by the logic designer.

(3) Hierarchical Interconnection of Functions Although maintaining the modularity of the logic designer's hierarchy is essential to optimal floorplanning, it is not by itself sufficient. The interconnection of functions throughout the hierarchy is also taken into account in the particular "cost function" which is to be optimized.

The cost function employed in the preferred embodiment of this invention (the *"Partition Cost Function,"* described in greater detail below) minimizes the sum of (1) the expected number of connections across slicing regions, which contain partitioned groups of functions, and (2) the proportional difference between the areas of the functions in each such group. This Partition Cost Function is used to determine the relative placement of children within their parent, such that heavily connected functions are placed together.

In order to account for the interconnection of functions across different levels of the hierarchy, the connections among functions at each level are appropriately weighted, to reflect the expected number of connections between any two functions, thereby enabling the relative placement of such functions within their parent. This process is repeated in a top-down fashion, with the placement of functions at each level reflecting the placement of functions at higher levels (as well as the connections among functions throughout the hierarchy).

The preferred embodiment of this invention involves an automated system (with procedures for manual intervention) which, given the total area of a chip, a hierarchy of functions, and a net list of the interconnections among terminal functions, places such functions within the chip so as to minimize the required area occupied by such functions and their interconnections, and to maximize the probability that such interconnections can be routed within that area.

This embodiment involves four basic phases: (1) Initialization; (2) Relative Placement; (3) Shape Determination and (4) Routing Channel Allocation.

Briefly, the Initialization phase involves, in addition to the setting of default variables and constants, the estimation of the area of each function, and the relative weighting of the connections between functions, throughout the hierarchy.

The Relative Placement phase involves the partitioning of functions within their parent function (based in part upon the weighted interconnection of functions throughout the hierarchy), and the slicing of such parent functions, enabling the placement of functions relative to one another, within their parent, at each level in the hierarchy. This relative placement is represented by hierarchically linked slicing trees.

The Shape Determination phase involves the determination of shape functions for each function (representing a range of that function's possible shapes), from the bottom to the top of the hierarchy, eventually yielding the shape function of the chip itself. By selecting the shape of the chip, the shape of each function on the chip is automatically determined from its shape function.

Relative "slice coordinates" of children (within their parent) are calculated (for the slicing region surrounding the parent), and then translated into absolute coordinates to account for the interrelationship of functions across levels of the hierarchy. These relative slice coordinates simply indicate the location of each child, relative to the location of its parent (i.e., treating the parent as the entire chip for the purpose of calculating such coordinates).

Finally, the Routing Channel Allocation phase involves a determination of the additional channel area required to route interconnections among functions, and then a redetermination of the shape of each function based upon these additional channel areas.

The system provides a graphic display of the floorplan, including the interconnection of functions, at all or some levels of the hierarchy. Means are also provided for the user to interact with the system in a variety of ways, performing various parts of the floorplanning process (such as relative placement and shape determination) manually.

Finally, for any particular logic design, the system supplies the user with two percentages, one indicating the "feasibility" of laying out that design in the specified chip area, and the other indicating, after the floorplan is complete, the "routability" of that particular floorplan (i.e., the likelihood of successfully routing that floorplan in the specified chip area).

This invention is described in greater detail below, in conjunction with the following drawings.

BRIEF DESCRIPTION OF THE DRAWINGS

FIG. 3 illustrates the method by which this system determines the expected number of connections between any two functions in the hierarchy.

FIG. 5 illustrates the Exhaustive Partitioning method by which this system, after generating all 2X possible permutations for partitioning X functions, places these functions relative to one another within their parent function.

FIG. 8 illustrates the method by which this system, after having determined the placement of functions relative to one another within their parent, determines the shape of such functions, and thus their precise location on the chip (not yet accounting for routing channel allocation).

DETAILED DESCRIPTION OF THE PREFERRED EMBODIMENT

The following description is meant to be illustrative only and not limiting. While the preferred embodiment of this invention is described, other embodiments (distributing the functionality of this novel hierarchical floorplanning method among various forms of software and/or hardware) will be obvious in view of the following description.

INPUTS

Figure 1:
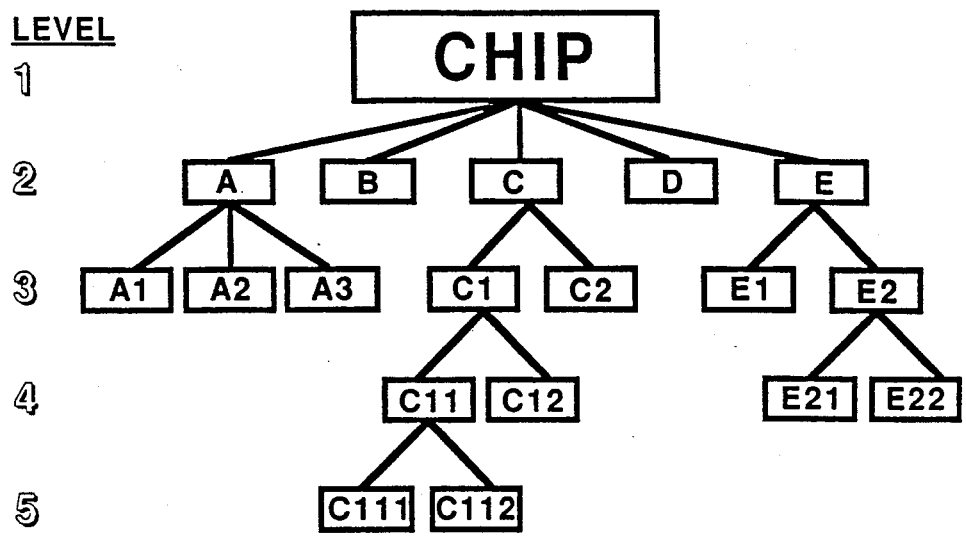
FIG. 1 illustrates an example of a hierarchy of functions specified by the logic designer, as well as the net list of interconnections among the terminal functions of that hierarchy.

FIG. 1 illustrates an example of a logical hierarchy of functions which this system might be asked to process. The CHIP itself constitutes Level 1 of the hierarchy, while its children, A, B, C, D and E, constitute Level 2. Level 3 contains the children of A (A1, A2 and A3), the children of C (C1 and C2) and the children of E (E1 and E2). Level 4 contains the children of C1 (C11 and C12) and the children of E2 (E21 and E22). Finally, Level 5 contains the children of C11 (C111 and C112).

Note that terminal functions exist not merely at the bottom of the hierarchy Level 5 (C111 and C112), but also at Level 2 (B and D), Level 3 (A1, A2, A3, C2 and E1) and Level 4 (C12, E21 and E22). The NET LIST indicates the interconnections among such terminal functions. For example, Net 1 indicates that functions A1, C111, E1 and E22 are interconnected, although it does not specify which pairs of such functions will actually be connected directly. As described in greater detail below, however, the system embodying this invention estimates the expected number of connections between such functions.

BASIC SYSTEM ARCHITECTURE

Figure 2:
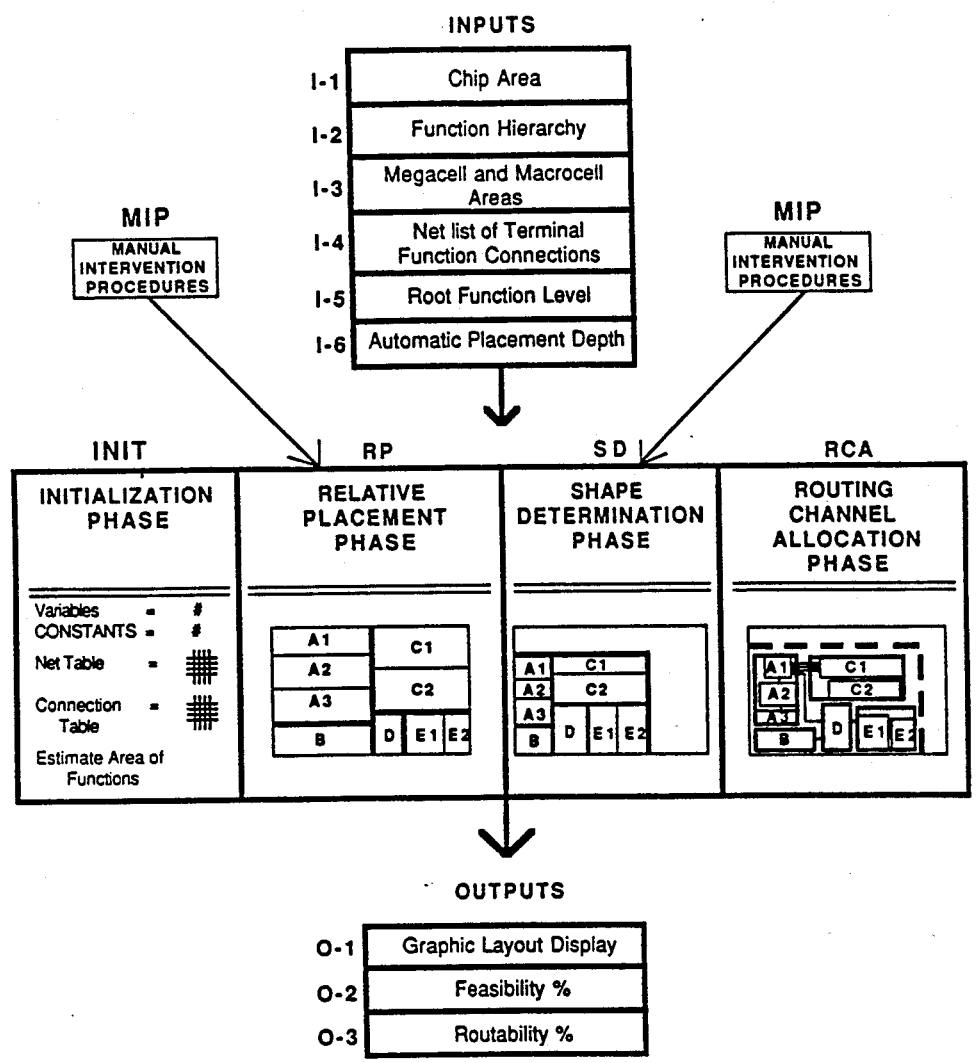
FIG. 2 illustrates the basic system architecture of the preferred embodiment of this invention.

FIG. 2 illustrates the basic components of this hierarchical floorplanning system. The system takes as input the specified chip area I-1, the logical hierarchy of functions I-2, the area of megacells and macrocells I-3, and the net list of interconnections among the terminal functions I-4. In addition, the user specifies the "root function" I-5—the function from which automatic placement should begin—and the number of levels I-6 below the root function which the system should automatically place.

Manual intervention procedures MIP enable the user to interact with the system during processing, by performing various tasks, such as manually shaping, or also placing, a function's elements. The system accepts the results of such manual intervention as if it had automatically performed such tasks itself, or as if such results were part of the initial logic design.

Upon receiving the specified logic design, the system enters its Initialization phase INIT, whereupon it initializes certain variables and constants, and performs other preprocessing tasks, such as estimating the area of each function, and weighting the interconnections between such functions, throughout the hierarchy.

Following initialization, the system enters its Relative Placement phase RP, whereupon, at each level in the hierarchy, it places functions relative to one another within their parent. Such relative placement at each level takes into account not only the hierarchy of functions, but also the interconnection of functions at all other levels.

The position of each function is determined more precisely (i.e., global coordinates are determined for each function on the chip) during the Shape Determination phase SD. During this phase, the system determines the shape of each function, by creating a hierarchy of shape functions, each of which represents a range of possible shapes of each function (based upon their relative placement as well as the estimated area of each function), and then selecting the shape of the chip, thereby determining the precise shape of each function down through the hierarchy. The position of each function at this point is only temporary, however, because the area required for routing interconnections among functions has not yet been taken into account.

The precise position of each function (including allocation of routing area) is finally determined, during Routing Channel Allocation phase RCA, by essentially repeating phase SD after determining, and taking into account, the additional channel area required to route the interconnections among functions.

The system then graphically displays the results O-1 of the floorplanning process, enabling the user to specify which levels and interconnections it should display. It also displays final Feasibility O-2 and Routability O-3 percentages to aid the user in determining the extent to which manual fine tuning is required.

INITIALIZATION PHASE

The system performs a variety of initialization tasks, including the following:

It sets certain variables to their default values (if the user fails to specify their values). As a default, it will place the clock in the center of the chip (in a vertical orientation), and will begin automatic placement at the top (chip) function and place functions throughout all levels of the hierarchy.

It also sets the value of certain constants, indicating the width and height of the "center region" (the region of the chip available for the placement of functions), the width of the clock (based on its given area and its vertical or horizontal orientation in the center of the chip), and the relative weight of interconnection units to area units. In addition, it sets the initial value of certain global variables, such as those representing the total number of functions in the hierarchy, the maximum number of children permitted under a function and the total number of nets specified by the user.

The system traverses the hierarchy in a "preorder" (parent before children, as opposed to "postorder," children before parent) fashion to correct any mistakes the user may have made in specifying that hierarchy. If, for example, a function consists of more than one megacell, a function must be formed for each such megacell. Similarly, if a function consists of a megacell and a collection of macrocells, one function must be formed for the megacell, and another for the collection of macrocells.

It traverses the hierarchy tree to initialize certain fields associated with each function. Some of these fields indicate whether the function is "flippable," "reshapable," and/or "rotatable." A flippable function is one which can be turned on either its horizontal or vertical axis, while a rotatable function is one which can be rotated in a clockwise or counterclockwise direction. A reshapable function is one whose dimensions are not fixed for a specified area.

Other fields indicate the level in the hierarchy at which each function resides, and the total number of offspring (children, grandchildren, and the like) defining each function.

Still other fields indicate whether each function, and/or its children, has previously been placed or had its shape determined (manually or automatically). Finally, the slice coordinates of each function are set (initially to reflect the entire center region of the chip as the boundary for possible placement, but later updated as placement is determined more precisely).

Chief among the system's initialization tasks is the estimation of the area of each function in the hierarchy. This estimation is achieved in a two step process: (1) estimation of the area of each macrocell function, and (2) estimation of the area of each function of functions.

The areas of the top (chip) function and megacell functions are, of course, specified by the user. The top function's minimum width and height are set to the width and height, respectively, of the center region, while its area is set to the product of that width and height. The minimum width and height of each megacell function, as well as its actual width and height, are set to the respective width and height of the megacell specified by the user, while the area is set to the product of that width and height. The channel width and height of each function is initially set to zero.

The minimum width and height of each macrocell function are set to the widest and tallest macrocells, respectively, while the area and actual width and height of each macrocell function are estimated as described below. The minimum width and height of each function of functions are set to the largest of the minimum widths and heights, respectively, of its children, while the area and actual width and height of each function of functions are estimated as described below.

The system estimates the area of each macrocell function by summing the areas (provided by the user) of each macrocell in that function, and then calculating the number of tracks per channel connecting such macrocells. The statistical formula used to relate the combined area of elements within a function to the average number of tracks per channel needed to interconnect such elements is:

$$t = aC^b$$

where t is the average number of tracks per channel, a and b are constants (equal to 0.435 and 0.345, respectively), and C is the complexity of the function (expressed as the sum of the areas, in square microns, of the macrocells within that function).

Once the average number of tracks per channel is determined for a particular macrocell function, the area of that function can be estimated by summing the specified areas of each macrocell, and adding, for each channel, the product of the average number of tracks per channel and the known width of an average track. Although this macrocell function can be reshaped, its width and height are each initially set to the square root of its area.

Given the area of each megacell function and the estimated area of each macrocell function, the system then estimates the area of each function of functions up through the hierarchy. This is accomplished by first determining the "slackness" of the hierarchy—i.e., the percentage of the center region area on the chip which is available for routing connections among functions- —and then distributing that available routing area uniformly to each function of functions.

The percentage of slackness in the hierarchy (initialized to 1%) is determined by first approximating the area occupied by each megacell function and macrocell function, according to the following formula:

$$area = (function\ area) * (1 + slackness\ \%)^{(function\ level - 1)}$$

where the slackness percentage plus one is raised to the power of the level of the function (less one), and then multiplied by the area of that function. The areas of all megacell and macrocell functions are then summed. If this total area equals or exceeds the area of the center region of the chip (less the area occupied by the clock), the slackness percentage is decremented by one percent, and now represents the slackness of the entire hierarchy. Otherwise, the slackness percentage is incremented by one percent, and the process is repeated until that total area equals or exceeds the center region area (less the clock area).

Once the percentage of slackness in the hierarchy is determined, the area of each function of functions is estimated by adding the sum of the areas of its children functions to the product of such sum and the slackness percentage. This additional product estimates the additional routing area necessary to interconnect the children functions.

Although this function of functions can be reshaped, its width and height are initially set to the square root of its area, and, if either is below its respective minimum, it is set to that minimum and the other is set to the function's area divided by that minimum.

Once it estimates the area of all functions throughout the hierarchy, it can later update these areas as the relative placement and precise shape of each of its children is determined.

The system also allocates certain data structures and tables. The data structure of each function has essentially already been described. It includes, for each function, (1) its absolute slice coordinates, (2) its level in the hierarchy, (3) its total number of offspring, (4) its width, height, and minimum width and height, (5) its area, (6) its fixed area (the product of its width and height, after subtracting their minimum value, to reflect the fact that less square function shapes require greater routing space), (7) whether it is flippable, reshapable and/or rotatable, (8) whether it and/or its children have been placed, (9) whether its shape has been determined, (10) a pointer linking it to its associated column in the "Net Table," (11) pointers to its corresponding place both in its slicing tree, and in the slicing tree of its parent, and (12) its channel width and height.

The other two major data structures are the "Net Table" and the "Connectivity Table." The Net Table is a two-dimensional array which contains a number of columns equal to the total number of functions throughout the hierarchy, and a number of rows equal to the number of nets specified by the user. Each of its entries indicates whether a particular function (column) is included in the net (row), and also indicates, by means of a pointer, the next net (row) which includes that function. This Net Table is used to determine quickly which functions are connected by which net.

The Connectivity Table is a two-dimensional array which contains a number of rows (and an equal number of columns) equal to the total number of functions throughout the hierarchy. Its entries indicate the expected number of connections between any two functions, taking into account all connections among functions throughout the hierarchy. These entries are utilized by the system to place functions at each level of the hierarchy, taking into account connections between such functions and other functions across various levels of the hierarchy.

Connections among terminal functions (specified in the net list provided by the user) are first weighted by assigning a value of "2/X" to each connection between two functions connected by a net, where X equals the number of functions connected by that net. This weighting reflects the fact that connecting X functions requires a minimum of (X−1) connections, which connections are not actually determined until the actual layout process occurs.

The "expected number of connections" between any two functions connected by a net is thus equal to the actual number of connections among all X functions (X−1) divided by the number of permutations of such connections (X*(X−1)/2). This, of course, simplifies to 2/X.

For example, FIG. 3 illustrates the processing of Net 1 from FIG. 1. Although this net connects 4 functions (A1, C111, E1 and E22), only 3 connections are required in order to connect these 4 functions, as illustrated by the "spanning tree" in FIG. 3 (i.e., the graph of the minimum number of connections among two or more functions).

Note, however, that the spanning tree connecting these 4 functions indicates that three connections exist, but does not determine (despite its appearances to the contrary) which functions are actually connected directly. There are six possible permutations of connected pairs of these 4 functions, as illustrated in FIG. 3.

Because the system does not know which 3 (of the 6 possible) pairs of functions will be connected directly, it determines the expected number of connections, for each of the 6 possible pairs of functions, by assuming that the 3 actual connections are equally likely to occur among the 6 possible pairs of functions, yielding an expected ½ of a connection for each such pair.

It repeats this process for all nets, accumulating, for each pair of terminal functions, its expected number of connections. Connections to nonterminal functions can then be determined by bringing the connections among terminal functions up through the hierarchy.

For example, as illustrated in FIG. 3, because the expected number of connections between A1 and C111 equals ½ (at least after processing Net 1), the expected number of connections between A and C (i.e., the expected number of connections between the offspring of A and offspring of B) also equals ½. Similarly, the expected number of connections between A and E equals 1 (½ for the connection between A1 and E1, and ½ for the connection between A1 and E22), and the expected number of connections between C and E equals 1 (½ for the connection between C111 and E1, and ½ for the connection between C111 and E22).

The system repeats this process until it has determined the expected number of connections between each pair of functions throughout the hierarchy.

This expected number of connections between any two functions represents the connections, throughout the hierarchy, among their offspring. This enables the system to place functions relative to one another within their parent at higher levels, based upon lower level connections among the offspring of such functions.

Finally, prior to any floorplanning, it calculates, for the specified logic design, a percentage representing the "feasibility" of laying out that design in the specified chip area. This number is calculated by first randomly placing the functions in the specified chip area, and then determining how much routing space is actually required. The feasibility percentage equals the available space for routing (the specified chip area less the sum of the areas of all functions) divided by the routing space actually required. This percentage is, of course, limited to 100%.

RELATIVE PLACEMENT PHASE

The purpose of the Relative Placement phase is to place every function, at each level in the hierarchy, relative to all other functions within their parent (taking into account the interconnections among such functions throughout the hierarchy).

Figure 4:
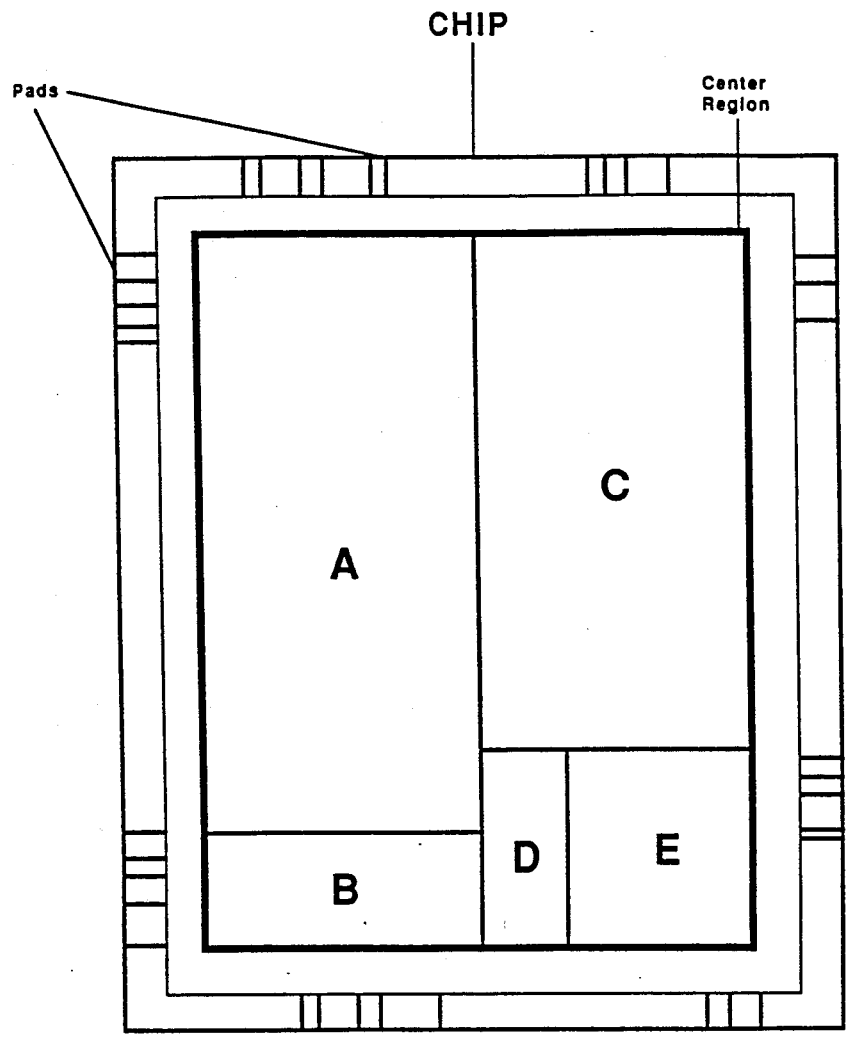
FIG. 4 illustrates an example of the results of the Relative Placement phase, for five functions at the level immediately below the chip level.

For example, FIG. 4 illustrates five functions (A, B, C, D and E) at the level (level 2) immediately below the top (chip) level. The result of this phase, for that level, was to place functions A and B to the left of functions C, D and E, with function A above function B, function C above functions D and E, and function D to the left of function E. Strongly affecting this relative placement, however, were the connections, throughout the hierarchy, among the offspring of A, B, C, D and E. The relative weight of these connections must be considered in order to optimize the placement of functions at each level.

While this relative placement does not determine precisely where each function is placed, it does maintain the hierarchical structure specified by the logic designer, and also sets the stage for more precise placement during the Shape Determination and Routing Channel Allocation phases.

Before relative placement can begin, the system must first determine whether the user manually placed any functions. If so, such manual placement may have effectively divided the hierarchy tree into a group of independent subtrees, such that each manually placed function, if it has children which have not yet been placed, constitutes the root of one such subtree. In addition, the root function of the entire tree (or a lower-level root function, selected by the user, from which automatic placement will begin) constitutes the root of a subtree requiring automatic placement.

The system generates the subtrees requiring automatic placement by traversing the tree in preorder fashion. The system weeds out functions which have no children, or which have children that already have been placed. Unless the root function (usually the top function) falls into either of these categories, that root function will qualify as one subtree. The system also weeds out functions which are "unshaped"—i.e. 1 which have not been manually placed (and thus shaped)—because such functions lie within the root function's subtree, and do not themselves constitute subtrees. Thus, the remaining subtrees are formed from manually placed functions which have children that have not yet been placed.

For example, in FIG. 1, if the user had manually placed C1 and C2 inside C, not only would the chip constitute the root of a subtree, but C1 would also constitute the root of a subtree. C2 would not, however, constitute the root of a subtree because it has no children.

The system then processes each subtree, by placing all functions, at each level, relative to one another within their parent. The functions are placed at each level of the hierarchy in preorder fashion. Each step of the relative placement process concerns a parent function, and the placement of its children (if not already either manually or automatically placed) relative to one another within that parent function.

Functions are placed within their parent by slicing the parent, either vertically or horizontally, partitioning the children into two groups (one on each side of the slice), and then repeatedly slicing and partitioning the groups of children until each child is isolated into its own slicing region.

The system employs two methods to partition the children into two groups (one on each side of the slice), both of which account for the interconnections among the children, as well as from the children to other functions, by relying upon the weighting of such interconnections, explained above with respect to the Initialization phase.

The first method, "Exhaustive Partitioning" (illustrated in FIG. 5), is used if there are fifteen (the limit currently being used by the system) or fewer children to be placed in the parent. In essence, this method considers, for each slice, all $2^X$ possible partitions of X functions, where X is the number of functions in the slicing region most recently sliced.

Each possible partition of X functions is analyzed by calculating the value of the "Partition Cost Function" PCF for that partition. After each slice, the partition which yields the minimum Partition Cost Function is selected as the optimal placement of functions relative to that slice.

This PCF is the "cost function" which the system minimizes throughout the hierarchy. It enables the system to place heavily connected functions near one another, while still placing children within the area of the chip occupied by their parent.

There are two components of the Partition Cost Function, which are simply added together. Thus, it is the sum of these components which is minimized by the Partition Cost Function.

One component 1 attempts to minimize the difference of the areas between functions on each side of the slice. This component is computed by first calculating the absolute value of the difference between the sum of areas of functions on one side of the slice and the sum of areas of functions on the other side of the slice. The system then divides this absolute value by the sum of areas of all functions within the entire slicing region of the parent. Finally, it multiplies that amount by a constant (currently 1000), which reflects the difference between units measuring area (square microns) and units measuring the number of connections between functions.

The second component 2 of the Partition Cost Function attempts to minimize the number of connections across the slice. Using the net list (for connections among terminal functions) and the Connectivity Table (for the expected number of connections between any two functions), the system analyzes all connections to each of the functions within the slicing region, to determine the number of connections which cross the slice.

Each net in the Net Table can account for either zero or one connection across the slice, while entries in the Connectivity Table account for the "expected number of connections." A connection crosses the slice if such connection connects functions on both sides of the slice, or connects a function on one side of the slice to a function outside the parent's slicing region, but on the other side of the slice (determinable because functions are placed in preorder fashion—i.e., higher level functions have already been placed).

Each connection is analyzed, and all such connections are added together and then multiplied by a constant (currently 1), which reflects the difference between units measuring area and units measuring the number of connections between functions.

The system then computes the Partition Cost Function for that partition by adding components 1 and 2. This process is repeated for each of the $2^X$ possible partitions of the X functions in the parent's slicing region.

All possible partitions are generated by a "grey code" technique, which produces all possible partitions, but with the added effect that each partition which is generated differs from the previous partition in only one place—i.e., only one function need be moved across the slice. This technique permits speedy, though exhaustive, generation of all possible partitions.

If, however, there are more than fifteen children to be placed within their parent, the Exhaustive Partitioning method is no longer feasible. As the number of children functions X exceeds fifteen, generating the $2^X$ number of partition permutations soon requires too much computation time, even on today's state of the art computers.

Figure 6:
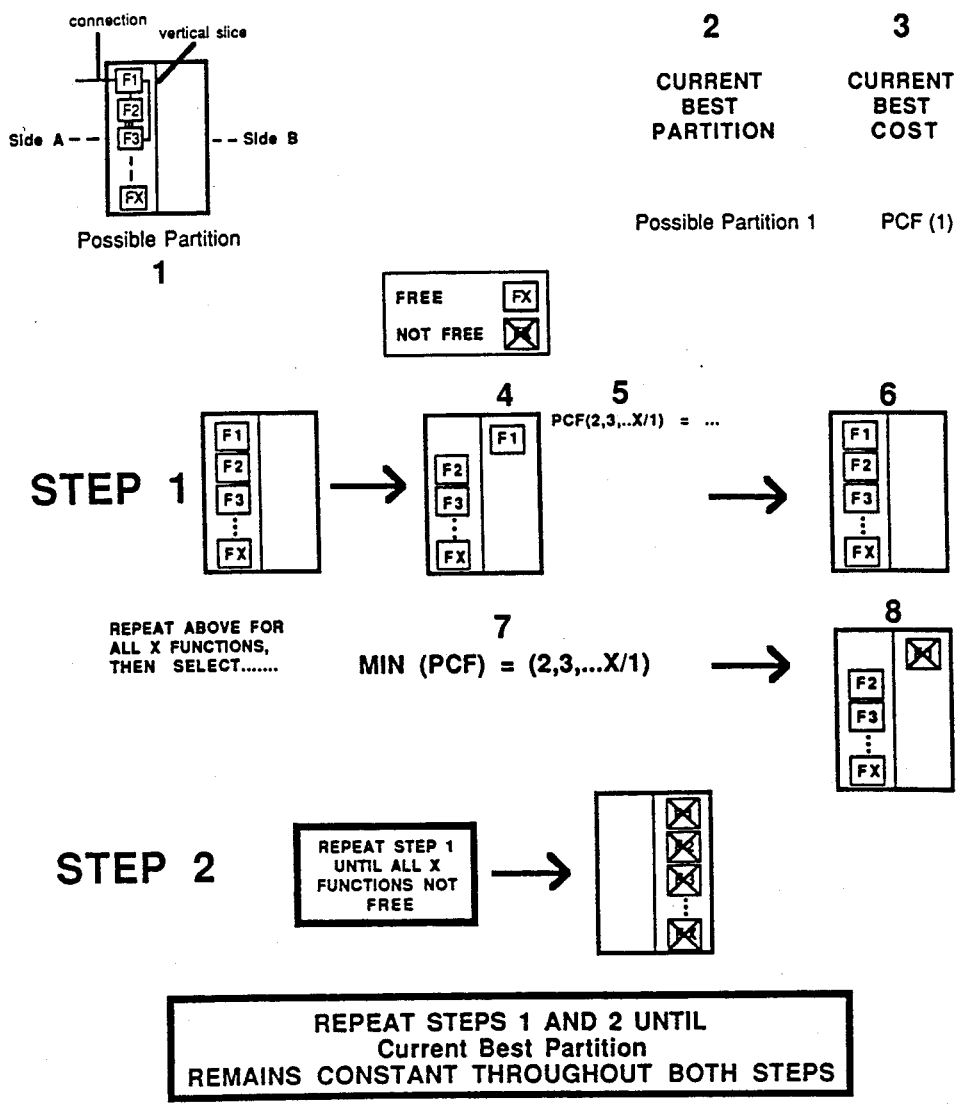
FIG. 6 illustrates the Heuristic Partitioning method by which this system, without generating all 2X possible permutations for partitioning X functions, places these functions relative to one another within their parent function.

Thus, a second method, "Heuristic Partitioning" (illustrated in FIG. 6), is required. This method does not necessarily generate the partition which yields the minimum Partition Cost Function, but it does approximate this optimum solution, by applying a variation of the Kernighan-Lin heuristic technique. See Kernighan, B. W. and S. Lin, "An Efficient Heuristic Procedure for Partitioning Graphs," *The Bell System Technical Journal*, February, 1970, pp. 291-307.

Beginning with any of the possible partitions (e.g., all functions on one side of the slice) 1, the system saves that partition as the "current best partition" 2, saves its Partition Cost Function as the "current best cost" 3, and designates all of its functions as "free." It then moves each of the X functions, one at a time, to the opposite side of the slice, in the following two steps:

1. The system moves any "free" function to the opposite side of the slice 4, calculates the Partition Cost Function for that partition 5, and then returns the function to its original position 6. It repeats this process for each "free" function, thereby creating a Partition Cost Function for each such function. It then selects the minimum of these Partition Cost Functions 7, and permanently moves its associated function to the opposite side of the slice 8, and designates it as "not free." Moreover, if this minimum Partition Cost Function is less than the "current best cost," then the "current best cost" is set to this lower value, and this new partition is saved as the "current best partition."

2. Step 1 is then repeated (moving only the remaining "free" functions) until each of the X functions has been moved to the opposite side of the slice.

If the performance of Steps 1 and 2 yields a new "current best partition," the system then designates all of the functions of that partition as "free" and again performs Steps 1 and 2. This process continues until the "current best partition" remains constant during an entire cycle of Steps 1 and 2, at which time the process stops, and that partition is selected as the best solution.

Whether each parent function is partitioned exhaustively or heuristically, that function's children are placed relative to one another within their parent (as illustrated in FIG. 4). After partitioning the parent function, the system defines a slicing region, not only for the parent, but for its children as well. For example, the slicing region associated with function A in FIG. 4 is illustrated by its surrounding rectangle. Function A may be placed anywhere inside that rectangle, and then represented by slice coordinates (0,0) for the lower left corner, (0,a) for the lower right corner, (b,0) for the upper left corner and (a,b) for the upper right corner.

These slicing regions represent the placement of children relative to one another within their parent. This process of slicing a region in half, and partitioning the functions of that region into two groups (one on each side of the slice) is repeated until all children are isolated into their own slicing region within their parent.

The process, of placing children relative to one another within their parent, is repeated throughout the hierarchy in a preorder fashion. After children are placed within their parent at one level, grandchildren are placed within the newly restricted slicing region of those children, and so on.

In this manner, the system maintains the hierarchy of functions, and places functions, at each level, relative to one another within their parent, based upon the weighted interconnection of functions throughout the entire hierarchy.

Thus, at the end of the Relative Placement phase, all children are placed relative to one another within their parent, and slicing coordinates are associated with each function, constituting the boundaries of that function's slicing region—i.e., the freedom with which that function can be moved within its parent. This freedom is restricted further, as the functions are more accurately placed, during the Shape Determination and Routing Channel Allocation phases, eventually yielding precise placement of all functions within the specified chip area.

SHAPE DETERMINATION PHASE

After the system places all functions (relative to one another within their parent) at each level, it then determines the shape of each function, thereby specifying its location within its slicing region, and thus precisely specifying its location on the chip. These precise shapes are, however, temporary, because the system must, during the next phase, allocate channel area for routing the interconnections among these functions. Allocating this channel area for routing may well alter the shape as well as the precise location of each function.

The Shape Determination phase also proceeds in a hierarchical manner, so as to maintain not only the hierarchy imposed by the logic designer, but also the system's relative placement of functions at each level within their parent function.

Figure 7:
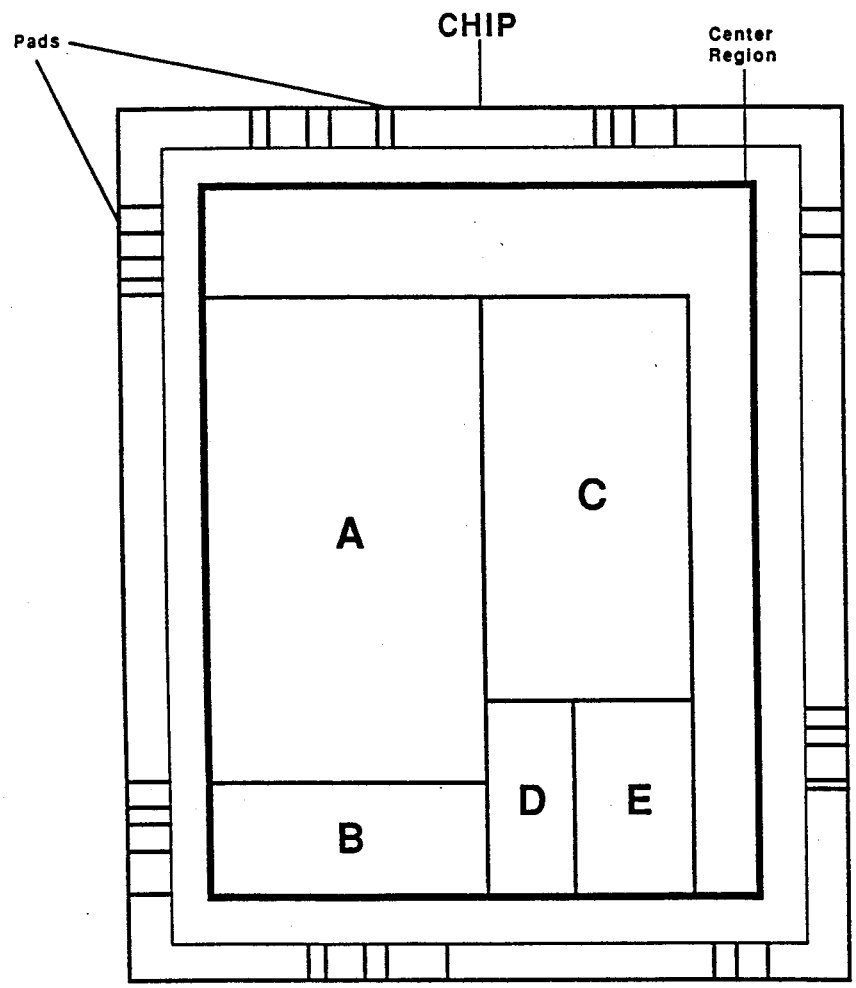
FIG. 7 illustrates an example of the results of the Shape Determination phase, for the same five functions whose relative placement is illustrated in FIG. 4.

The shape of each function is selected so as to minimize the wasted chip area, or, in other words, to maximize the available area for routing connections between functions. FIG. 7, when contrasted with FIG. 4, illustrates how the determination of the precise shape of each function minimizes this wasted area.

The shape determination method employed by the system is illustrated in FIG. 8. The system first determines, for each function in postorder fashion, a "shape function" 1 which represents a range of possible shapes which that function can assume. Certain functions (e.g., megacells or manually shaped functions) may already have a predefined shape (fixed width and height). Others may have a specified or estimated area, but no fixed dimensions. The range of a function's possible dimensions is limited by a "shape scale" (currently set at 10,000 mmicrons), such that the width and height of a function must each be multiples of that shape scale. Note that additional possible shapes may result from a function's ability to be rotated.

The system initially processes terminal functions, semiterminal functions (those at the lowest user-specified depth for automatic placement) and pseudoterminal functions (those manually or automatically placed and shaped, but with unplaced children). If the shape of any such function has not yet been determined, the system calculates its shape function, determining its possible dimensions from its specified or estimated area, and its minimum width and height. Placement of this shape is constrained by each function's slicing region, created during the Relative Placement phase.

Once these shape functions are determined, the system proceeds up the hierarchy, determining the shape functions of each parent 2, by "adding" the shape functions of its children, taking into account their relative placement within their parent. This addition of functions is accomplished as follows:

If a function is on top of or below another function 3, the shape function S1 which comprises both functions is calculated by selecting, as each X coordinate of S1, the corresponding X coordinates of each shape function, and, as each Y coordinate of S1, the sum of their corresponding Y coordinates. Similarly, if a function is to the left or right of another function 4, the shape function S2 is calculated by selecting, for corresponding Y coordinates, the sum of their corresponding X coordinates.

For example, the shape function of X (the parent of A and B) is created by adding the shape functions of A and B. Function A (with an area of 6) has the following possible shapes: (1,6), (2,3), (3,2), (4,2), (5,2) and (6,1). Function B (with an area of 4) has the following possible shapes: (1,4), (2,2), (3,2), (4,1), (5,1) and (6,1). Thus, because function A has been relatively placed on top of function B, function X has the following possible shapes: (1,10), (2,5), (3,4), (4,3), (5,3) and (6,2).

This process of determining the shape functions of each parent, by adding the shape functions of its children, continues up through the entire hierarchy, until a shape function is determined for every function in the hierarchy, including the root function.

Once a shape function has been determined for each function in the hierarchy, the system selects the particular dimensions of the root function which not only fit into its shape function, but which yield the shape closest to a square (because less square functions require greater routing space). For example, given a root function with an area of 100 square microns, the system would select a shape of 10 microns×10 microns over a shape of 50 microns×2 microns, because the latter would require greater routing space.

Once the shape of the root function has been selected, the shape of each of its offspring is thereby automatically determined. This is so because a shape function can, by definition, yield only one possible shape, given the shape function of its parent. Thus, in this manner, the system determines the shapes of all functions in the hierarchy.

Once it determines the shape of each function, the system must update that function's relative slice coordinates to reflect the fact that the function's slicing region is now more constrained. Not only is the new slicing region limited to the precise shape of the function, but the function's location within the former slicing region is also precisely determined (because the shape of each parent function incorporates the shapes, and thus locations, of its children).

Finally, the system sets certain flags, indicating which children have been placed into their parent, and which have had their shape determined. This enables the user to specify automatic placement and shape determination at only certain levels, and then later request that the system automatically place and determine the shape of functions at other levels. It also enables the system to keep track internally of the tasks it has performed to avoid conflicts during subsequent calls to these same procedures.

ROUTING CHANNEL ALLOCATION PHASE

After the system has placed all functions relative to one another throughout the hierarchy, and has determined the shape of each function, it has thereby determined the precise placement of each function on the chip. At this point, such placement does not, however, reflect the allocation of routing area required for connecting such functions. Channel space must therefore be allocated for routing the various interconnections among functions throughout the hierarchy.

The system accomplishes this task, during the Routing Channel Allocation phase, by estimating each function's channel width and height (i.e., the number of vertical and horizontal tracks, each multiplied by the known width of an average track, required to connect such function to other functions), and then repeating the Shape Determination phase, with each function's channel width and height included as part of its area.

Figure 9:
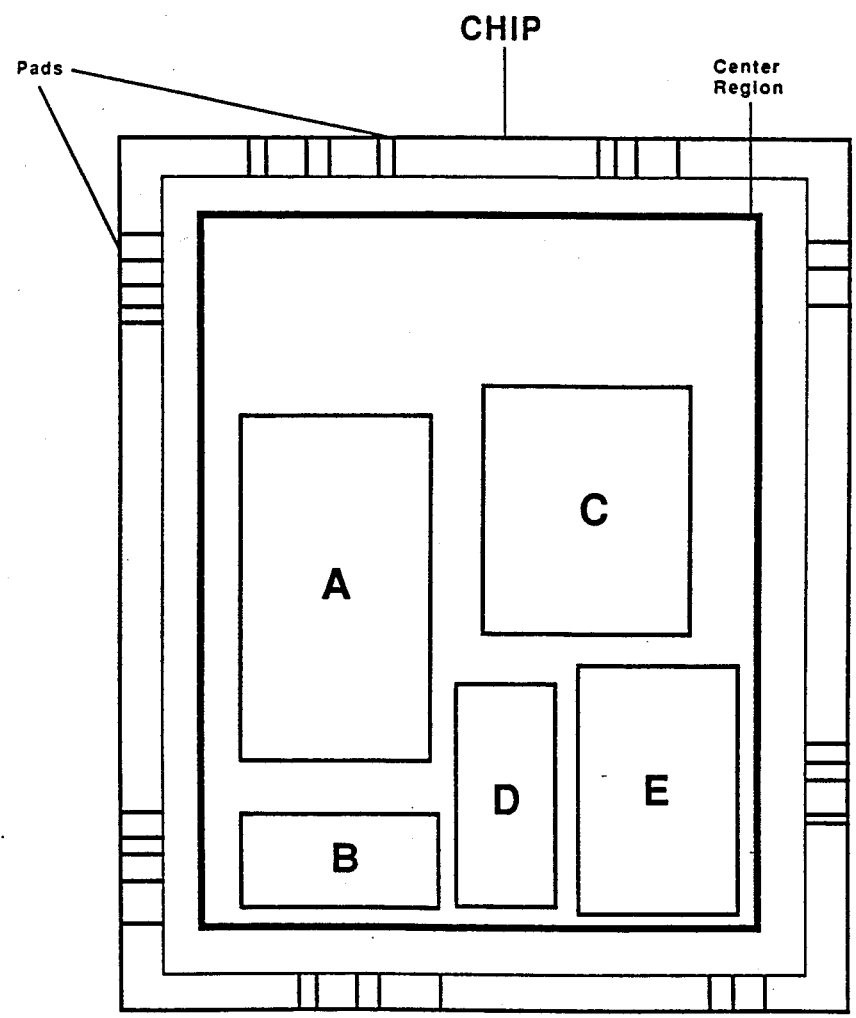
FIG. 9 illustrates an example of the results of the Routing Channel Allocation phase (and thus the entire automatic floorplanning process), for the same five functions whose relative placement is illustrated in FIG. 4 and whose shapes are illustrated in FIG. 7.

FIG. 9 contains an example of the results of the Routing Channel Allocation phase. When compared to FIG. 7, it illustrates the modifications to the shape and location of functions which the system makes during this phase to accommodate the routing space necessary to interconnect such functions.

The system calculates each function's channel width and channel height, prior to repeating the Shape Determination phase. This calculation is, of course, highly dependent upon the system's previous placement and shaping of such functions.

The system processes each function in the hierarchy in postorder fashion. This enables it to determine, hierarchically, the channel routing area required among children (within their parent), and then among parents at the next higher level, and so on, until it has allocated such routing area among all functions in the hierarchy.

The system determines the expected number of vertical tracks and horizontal tracks required to interconnect the children of a parent function, using the Connectivity Table to determine the expected number of connections between each child and its "siblings" (other children of that function's parent). It then repeats this process in postorder fashion up through the entire hierarchy, to determine the expected number of vertical tracks and horizontal tracks required to connect higher level functions to their siblings.

The system initially assumes that each function is connected from its center, and thus calculates the smallest rectangle which includes the centers of all interconnected siblings. It also assumes that all routing among these functions will occur within that rectangle. The width and height of the rectangle represent an estimate of the total length of the horizontal and vertical "wires," respectively, required to connect such functions.

If four or five children are interconnected, the estimated length of these horizontal and vertical "wires" is actually 20% longer than the respective width and height of the rectangle. If six or more children are interconnected, such estimated length is actually 30% longer than the respective width and height of the rectangle. The system accounts for this additional length by adding, to each function's expected number of vertical tracks and horizontal tracks, the appropriate percentage (either 20% or 30%) of such numbers.

Similarly, the system accounts for the expected number of connections between any two children, by multiplying each child's expected number of vertical tracks and horizontal tracks by such expected number of connections.

The system scans the area within the rectangle (horizontally, across the height of the rectangle, and vertically, across its width), creating imaginary horizontal scan lines and vertical scan lines at each edge (in the direction of the scan) of each function that intersects the rectangle. The system then examines, within the rectangle, the scan areas between each horizontal scan line and the previous such scan line, and the scan areas between each vertical scan line and the previous such scan line, to determine the probability that at least some portion of a vertical or horizontal track, respectively, will run alongside each particular function intersected by such scan areas.

This probability is calculated, for each function intersected by each scan area, by dividing the portion of the scan line which intersects that function, within the rectangle, by the sum of all such portions of each function intersected by that scan line.

For each function intersected by each scan area, the system also calculates the percentage of a track which will run alongside that particular function, in the event that some portion of the "wire" within the scan area runs alongside that function.

For each such function, the system then multiplies the probability that a portion of a track will run alongside that function, by the corresponding portion of that track which will be required, and sums that product over all scan areas intersecting that function, to determine the expected number of horizontal and vertical tracks required to connect that function to the other connected functions.

Figure 10:
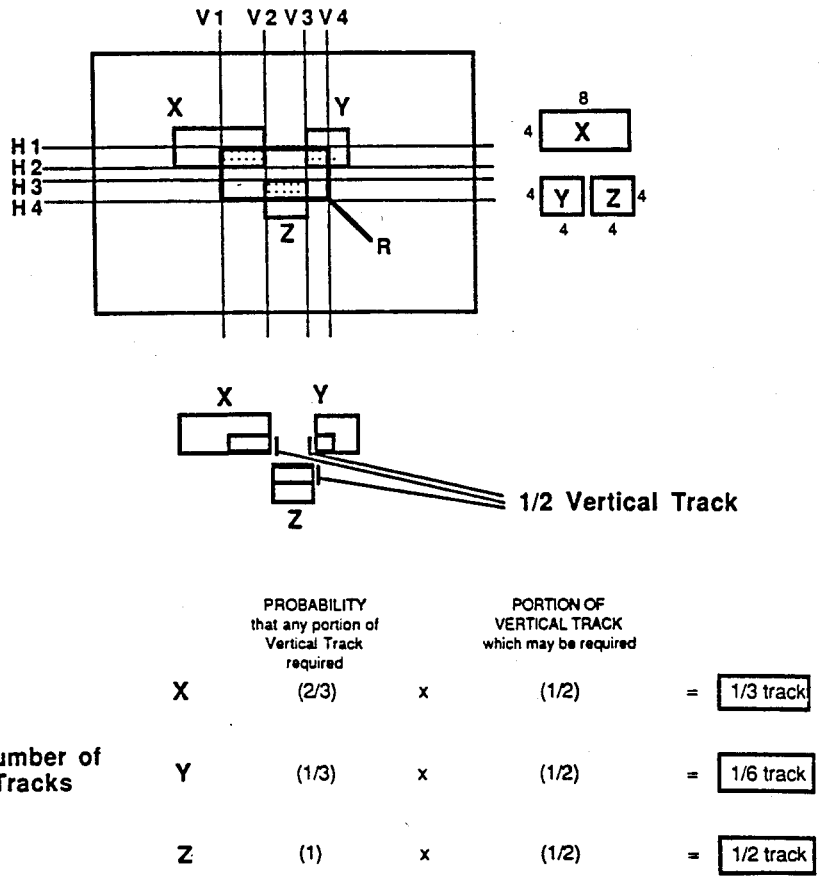
FIG. 10 illustrates an example of the method by which this system allocates to each function the required channel width and height necessary to connect such function to other functions, before it redetermines the shape (and thus the precise location on the chip) of each such function.

For example, as illustrated in FIG. 10, the system processes the interconnections among children X, Y and Z by creating a rectangle R, which connects the centers of X, Y and Z, and by defining imaginary horizontal scan lines (H1, H2, H3, and H4) and vertical scan lines (V1, V2, V3 and V4).

Regarding solely vertical connections for this example, the area in between H1 and H2 indicates that a vertical connection is twice as likely to run alongside X than Y, because the width of X, within R (where all routing is assumed to occur), is 4, twice the width (2) of Y within R. Thus, X has a $\frac{2}{3}$ probability (4/(4+2)) of requiring channel area to route this portion of the vertical connection, whereas Y has a $\frac{1}{3}$ probability (2/(4+2)). If a portion of a track is necessary alongside either X or Y, $\frac{1}{2}$ of a track will be required, because half of the height of X (and half of the height of Y) lies inside R.

Thus, the vertical "wire" connecting X, Y and Z requires $\frac{1}{3}$ of a vertical track (probability of $\frac{2}{3}$ multiplied by $\frac{1}{2}$ track) allocated to X, and 1/6 of a vertical track (probability of $\frac{1}{3}$ multiplied by $\frac{1}{2}$ track) to Y. Similarly, regarding the area between H3 and H4, because Z is the only function within that area, it is expected (probability of 1) to require $\frac{1}{2}$ of a vertical track (the percentage of the height of Z within R).

This process continues in postorder fashion up through the entire hierarchy, with the system scanning for all connections among children within their parent, until the expected number of horizontal and vertical tracks has been allocated to each function throughout the hierarchy.

It then multiplies each function's expected number of vertical tracks, and expected number of horizontal tracks, by the known width of a track, thereby yielding, for each function, a channel width and channel height, respectively.

The system then repeats the Shape Determination phase, including each function's channel width as part of its width, and each function's channel height as part of its height, resulting in the precise placement of each function on the chip, taking into account the extra space required to interconnect such functions.

It then graphically displays the results of this placement, with the additional routing area now removed from the functions themselves (as illustrated in FIG. 9, in which this routing area appears as blank space between functions). The connections among functions can also be displayed graphically.

OUTPUT AND MANUAL INTERVENTION

Once all functions (to the extent requested by the user) have been placed precisely within the chip area, the system graphically displays the results of this placement at any or all levels throughout the hierarchy.

Various graphics commands enable the user to focus on the placement of particular levels or functions, as well as particular interconnections among functions (including pad functions). The user can then manually fine-tune the results by adjusting the placement and/or shape of particular functions. The user can even repeat the entire floorplanning process, using such manual modifications as additional constraints upon the system's automatic floorplanning procedures.

Figure 11:
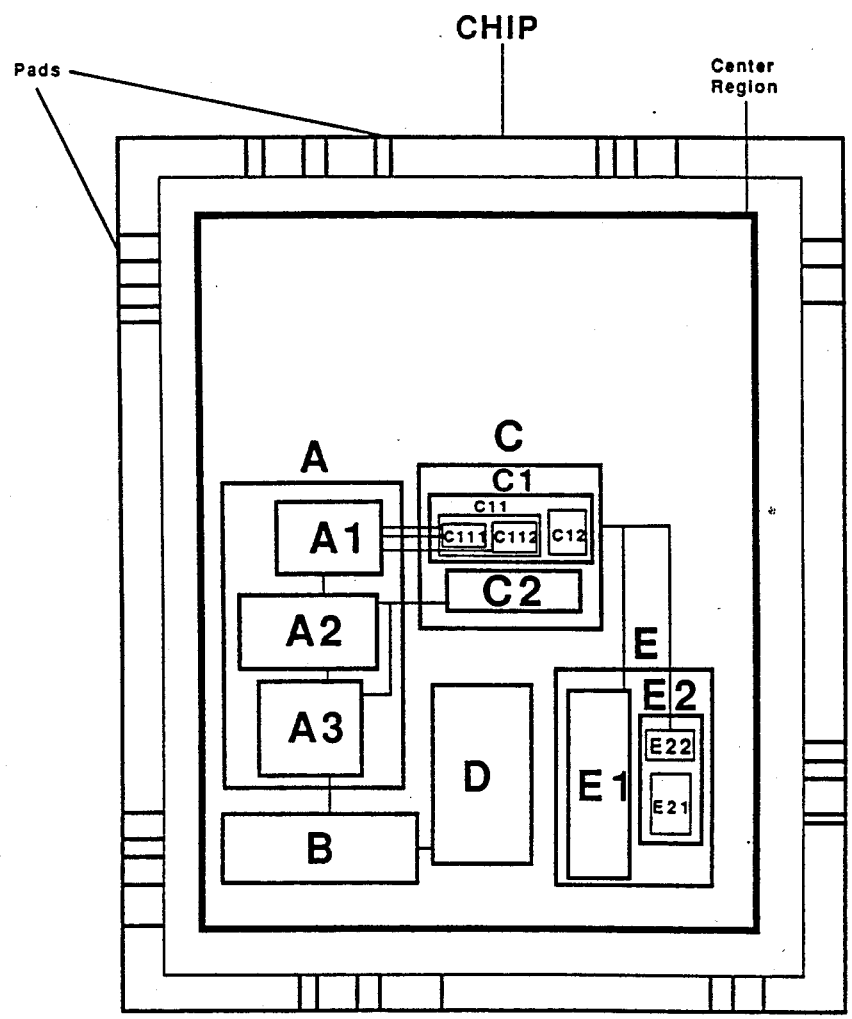
FIG. 11 illustrates an example of the improved results of the automatic floorplanning process (compared to those illustrated in FIG. 9) obtained when the user requests automatic placement of additional lower levels.

FIG. 11, when compared to FIG. 9, illustrates the improved results obtained when the user requests that the system automatically place levels at a greater depth in the hierarchy. When the user requests that it place a function's children, for example, thereby permitting it to determine the precise shape of these children, the system can more accurately determine the size of the function itself, and thus more accurately determine the required chip area.

Note, however, that the shapes and relative placement of functions A, B, C, D and E are very similar between FIG. 9 and FIG. 11. Regardless of the user's specified depth of automatic placement, the system considers the interconnection of functions across all levels of the hierarchy when placing functions at any particular level, thereby hierarchically (not independently) optimizing the placement at each level.

Finally, it displays Feasibility and Routability percentages which, as discussed earlier, indicate, respectively, the "feasibility" of laying out the user's logic design in the specified chip area, and the "routability" of the particular floorplan of that logic design produced by the system (i.e., the likelihood of successfully routing that floorplan in the specified chip area).

The routability percentage is determined in much the same manner as was the feasibility percentage described earlier. Instead of randomly placing the functions in the specified chip area, the system uses the actual floorplan it produces to determine how much routing space is actually required. The routability percentage equals the available space for routing (the specified chip area less the sum of the areas of all functions) divided by the routing space actually required. This percentage is, of course, limited to 100%.

This routability percentage indicates, in essence, the additional manual effort required by the user to achieve an actual layout of the logic design in the specified chip area. The user can then, as an alternative to exerting that effort, increase the chip area slightly and/or manually adjust the floorplan, and then invoke the system again until a sufficiently high routability percentage is obtained.

We claim:

1. A method of making, including floorplanning functions for, an integrated circuit, said integrated circuit comprising a hierarchy of N level of functions,
where N is an integer ($N \geq 1$) representing the number of hierarchical levels of functionality in the integrated circuit, the first of said levels representing the integrated circuit as a whole, and
where n is an integer ($1 \leq n \leq N$) representing the level of any particular function in the hierarchy,
said hierarchy defining at least one of said (n)th level functions (a parent function) as a plurality of (n+1)st level functions (children functions, each being a child function),
each child function (which is not also a parent function) being a terminal function, each terminal function being connected to at least one other terminal function, by at least one net,
each net defining a plurality of interconnected terminal functions, comprising the steps of:
designing the integrated circuit,
estimating the number of connections between functions throughout all N levels of the hierarchy,
determining the location on the integrated circuit of each (n)th level function in the hierarchy, based in part upon said estimated number of connections, and
fabricating the integrated circuit having the location of each (n)th level function as determined in the previous step.

2. The method of claim 1 wherein the step of estimating the number of connections between functions throughout all N levels of the hierarchy comprises the steps of:
determining the expected number of connections between the terminal functions connected by each net, by dividing the minimum number of connections among said terminal functions by the total number of permutations of pairs of said terminal functions, and
determining the expected number of connections between each nonterminal function and all other functions in the hierarchy, by summing the expected number of connections between the terminal functions which are children functions of said nonterminal function and all the other terminal functions.

3. The method of claim 1 wherein the step of determining the location on the integrated circuit of each (n)th level function in the hierarchy comprises the step of determining the location on the integrated circuit of each child function in the hierarchy, such that said child function is placed in the area of the integrated circuit occupied by its parent function.

4. The method of claim 1 wherein the step of determining the location on the integrated circuit of each (n)th level function in the hierarchy comprises the step of:
determining the location of (n)th level children functions relative to one another within their parent, including
determining the location of 2d level children functions, relative to one another within their parent, based in part upon said estimated number of connections, and
determining the location of (n)th level children functions ($n \geq 3$), relative to one another within their parent, based in part upon both said estimated number of connections and the location of (k)th level children functions ($k \leq n$), relative to one another within their parent.

5. The method of claim 4 wherein the step of determining the location of (n)th level children functions relative to one another within their parent comprises the steps of:
partitioning said children functions into two groups,
determining the location on the integrated circuit of each of said two groups relative to the other, and
successively partitioning each of said two groups of functions into two groups, and determining the location on the integrated circuit of each of said latter two groups relative to the other, until each of said groups contains exactly one function.

6. The method of claim 5 wherein the steps of partitioning said children functions into two groups and determining the location on the integrated circuit of each of said two groups relative to the other comprises the steps of:
dividing the parent function into two regions, such that each of said regions is either on top of, below, to the left of, or to the right of the other, each of said two regions comprising one of said two groups of functions,
calculating, for a plurality of the possible permutations of said functions between said two groups, the absolute value of the difference between the sum of the areas of the functions in one of said two groups and the sum of the areas of the functions in the other of said two groups, said absolute value divided by the sum of the areas of the functions in both of said groups (the proportional area difference),
using said estimated number of connections to calculate the number of connections between functions in one of said two groups and either functions in the other of said two groups or functions not in either of said two groups but on the same side of the line separating said two regions as is the other of said two groups, and
selecting said permutation of said functions between said two groups which yields the minimum sum of said proportional area difference and said number of connections between functions, thereby determining the location on the integrated circuit of each of said two groups relative to the other.

7. The method of claim 1 wherein the step of determining the location on the integrated circuit of each (n)th level function in the hierarchy comprises the steps of
    defining a shape function, representing one or more possible shapes of each terminal function,
    determining the shape function of each parent function by combining the shape functions of its children functions, thereby determining the shape function of the integrated circuit, and
    selecting the shape of the integrated circuit, thereby determining the shape of each function on the integrated circuit.

8. The method of claim 7 wherein the step of determining the shape function of each parent function by combining the shape functions of its children functions comprises the steps of:
    determining whether the location of each child function, relative to another of said child functions, is above, below, to the left of, or to the right of said other child function,
    determining the X and Y coordinates of said parent's shape function, for each of said child functions which is either above or below said other child function, by calculating, for each X coordinate corresponding to the X coordinates of said children functions, the sum of the Y coordinates of each of said children functions, and
    determining the X and Y coordinates of said parent's shape function, for each of said child functions which is either to the left or to the right of said other child function, by calculating, for each Y coordinate corresponding to the Y coordinates of said children functions, the sum of the X coordinates of each of said children functions.

9. The method of claim 1 wherein the step of determining the location on the integrated circuit of each (n)th level function in the hierarchy comprises the steps of
    determining the locations of (n)th level functions relative to one another within their parent, including
        determining the location of 2d level children functions, relative to one another within their parent, based in part upon said estimated number of connections, and
        determining the location of (n)th level children functions (n≧3), relative to one another within their parent, based in part upon both said estimated number of connections and the location of (k)th level children functions (k<n), relative to one another within their parent, and
    transforming said locations of (n)th level functions relative to one another within their parent into precise locations on the integrated circuit, including
        defining a shape function, representing one or more possible shapes of each terminal function,
        determining the shape function of each parent function by combining the shape functions of its children functions, thereby determining the shape function of the integrated circuit, and
        selecting the shape of the integrated circuit, thereby determining the shape of each function on the integrated circuit.

10. The method of claim 9 wherein the step of determining the location on the integrated circuit of each (n)th level function in the hierarchy also comprises the steps of:
    estimating, and allocating to the area occupied by each function, the routing area required to connect that function to other functions on the integrated circuit, and
    repeating the step of transforming said locations of (n)th level functions relative to one another within their parent into precise locations on the integrated circuit, taking into account said routing area allocated to the area occupied by each function.

11. The method of claim 1 wherein the steps take into account all N levels of the hierarchy.

12. The method of claim 1, wherein some of the functions are psuedoterminal functions.

13. A method of making, including estimating the area occupied by (n)th level functions of, an integrated circuit, said integrated circuit comprising a hierarchy of N levels of functions,
    where N is an integer (N≧1) representing the number of hierarchical levels of functionality in the integrated circuit, the first of said levels representing the integrated circuit as a whole, and
    where n is an integer (1≦n≦N) representing the level of any particular function in the hierarchy,
    said hierarchy defining at least one of said (n)th level functions (a parent function) as a plurality of (n+1)st level functions (children functions, each being a child function),
        each child function (which is not also a parent function) being a terminal function, each terminal function being connected to at least one other terminal function, by at least one net,
        each net defining a plurality of interconnected terminal functions;
comprising the steps of:
    designing the integrated circuit,
    estimating the area of each terminal function which comprises many small cells the collective layout of which is not specified (macrocells), including estimating the number of tracks necessary to interconnect said macrocells,
    determining the area of said terminal function of macrocells by adding, to the sum of the areas occupied by said macrocells, the product of said number of tracks and the known width of the average track,
    estimating the area of each function which is not a terminal function, including
        estimating the precentage of the total area of the integrated circuit available for routing connections among functions, and
        distributing the available area uniformly to each parent function by summing the areas of each of its children functions, and multiplying that sum by said percentage, and
    fabricating the integrated circuit having the area occupied by each function as determined in the prior steps.

14. The method of claim 13 wherein the step of estimating the number of tracks necessary to interconnect said macrocells comprises the steps of
    raising the sum of the area occupied by said macrocells to a power equal to a first constant value, and
    multiplying that sum raised to that power by a second constant value.

15. A system for making, including floorplanning functions for, an integrated circuit, said integrated circuit comprising a hierarchy of N levels of functions, where N is an integer (N≧1) representing the number of hierarchical levels of functionality in the integrated circuit, the first of said levels representing the integrated circuit as a whole, and where n is an integer (1≦n≦N) representing the level of any particular function in the hierarchy;

said hierarchy defining at least one of said (n)th level functions (a parent function) as a plurality of (n+1)st level functions (children functions, each being a child function), each child function (which is not also a parent function) being a terminal function, each terminal function being connected to at least one other terminal function, by at least one net, each net defining a plurality of interconnected terminals functions, comprising:

means for designing the integrated circuit, means for determining the location of said integrated circuit of (n)th level children functions (n≧2), relative to one another within their parent, means for determining the shape of said (n)th level children functions, and means for fabricating the integrated circuit with each function having the location and shape as determined in the previous steps.

16. The system of claim 15 also comprising:

means for calculating the additional area required to interconnect said (n)th level children functions, and means for redetermining the shape of said (n)th level children functions, based in part upon said additional area.

17. The system of claim 15 also comprising means for graphically displaying the location on the integrated circuit of (n)th level functions.

* * * * *

UNITED STATES PATENT AND TRADEMARK OFFICE
CERTIFICATE OF CORRECTION

PATENT NO. : 4,918,614

DATED : April 17, 1990

INVENTOR(S) : Hossein Modarres et al.

It is certified that error appears in the above-identified patent and that said Letters Patent is hereby corrected as shown below:

On the title page, in item [57]:
Abstract, line 4, change "increase" to --increases--.

Col. 2, lines 21-22, "(1) Hierarchical Estimation of Unknown Function Area" is not underlined and runs into the next sentence.

Col. 2, line 38, "(2) Maintenance of Modularity" is not underlined and runs into the next sentence.

Col. 2, line 59, "(3) Hierarchical Interconnection of Functions" is not underlined and runs into the next sentence.

Col. 4, lines 30-31 "(1) Hierarchical Estimation of Unknown Function Area" is not underlined and runs into the next sentence.

Col. 5, line 13, "(2) Maintenance of Modularity" is not underlined and runs into the next sentence.

UNITED STATES PATENT AND TRADEMARK OFFICE
CERTIFICATE OF CORRECTION

PATENT NO. : 4,918,614

DATED : April 17, 1990

INVENTOR(S) : Hossein Modarres et al.

It is certified that error appears in the above-identified patent and that said Letters Patent is hereby corrected as shown below:

Col. 6, line 4, "(3) Hierarchical Interconnection of Functions" is not underlined and runs into the next sentence.

Signed and Sealed this

Fifteenth Day of October, 1991

*Attest:*

HARRY F. MANBECK, JR.

*Attesting Officer*  *Commissioner of Patents and Trademarks*